(12) United States Patent
Miyake et al.

(10) Patent No.: US 7,777,230 B2
(45) Date of Patent: Aug. 17, 2010

(54) DISPLAY DEVICE

(75) Inventors: Hidekazu Miyake, Mobara (JP); Takuo Kaitoh, Mobara (JP); Takeshi Noda, Mobara (JP); Toshio Miyazawa, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 109 days.

(21) Appl. No.: 12/155,788

(22) Filed: Jun. 10, 2008

(65) Prior Publication Data

US 2008/0308811 A1  Dec. 18, 2008

(30) Foreign Application Priority Data

Jun. 18, 2007  (JP) .............................. 2007-159698

(51) Int. Cl.
*H01L 27/14*  (2006.01)
(52) U.S. Cl. ................................. 257/72; 257/E33.053
(58) Field of Classification Search .................. 257/59, 257/64, 72, 79; 345/156, 206, 84, 87, 90, 345/92
See application file for complete search history.

(56) References Cited

U.S. PATENT DOCUMENTS 6,104,449 A * 8/2000 Takahashi et al. ............. 349/40
6,136,625 A  10/2000 Nakazawa
2005/0018114 A1 * 1/2005 Park et al. ................... 349/114

* cited by examiner

*Primary Examiner*—Thomas L Dickey
*Assistant Examiner*—Nikolay Yushin
(74) *Attorney, Agent, or Firm*—Stites & Harbison, PLLC; Juan Carlos A. Marquez, Esq.

(57) ABSTRACT

The present invention provides a display device having thin film transistors which can reduce an OFF current in spite of the extremely simple constitution. In the display device having thin film transistors on a substrate, each thin film transistor includes a gate electrode which is connected with a gate signal line, a semiconductor layer which is formed astride the gate electrode by way of an insulation film, a drain electrode which is connected with a drain signal line and is formed on the semiconductor layer, and a source electrode which is formed on the semiconductor layer in a state that the source electrode faces the drain electrode in an opposed manner, and a side of the drain electrode which faces the source electrode does not overlap the gate electrode as viewed in a plan view, and a side of the source electrode which faces the drain electrode does not overlap the gate electrode as viewed in a plan view.

12 Claims, 6 Drawing Sheets

DISPLAY DEVICE

BACKGROUND OF THE INVENTION

1. Field of the Invention

The present invention relates to a display device, and more particularly to a display device having thin film transistors.

2. Description of the Related Art

This type of display device is configured such that a plurality of pixels is arranged in a display part thereof in a matrix array, respective pixel rows are sequentially selected by turning on the thin film transistors provided to the respective pixels in response to a scanning signal supplied via a gate signal line, and at timing of such selection, a video signal is supplied to the respective pixels of the pixel row via a drain signal line to which the pixels of opposing pixel row are connected in common.

Further, a drive circuit which drives the display device may be formed around the display region which is formed of a mass of the respective pixels, and the drive circuit also includes the thin film transistor.

The thin film transistor is constituted of, for example, a gate electrode which is connected to the gate signal line, a semiconductor layer which is formed astride the gate electrode via an insulation film, a drain electrode which is connected with the drain signal line and is formed on the semiconductor layer, and a source electrode which is connected with the pixel electrode and is formed on the semiconductor layer in an opposed manner with the drain electrode.

The semiconductor layer arranged between the drain electrode and the source electrode functions as a channel region, and an electric current is supplied between the drain electrode and the source electrode via the channel region in response to a voltage applied to the gate electrode.

Further, the thin film transistor is usually configured such that an electric field attenuation region is formed between the channel region and the drain electrode as well as between the channel region and the source electrode. The electric field attenuation region is formed of a semiconductor layer of relatively high resistance, and due to the provision of the electric field attenuation region, it is possible to prevent the generation of concentration of electric field between the channel region and the drain electrode as well as between the channel region and the source electrode thus attenuating an OFF current.

As such an electric field attenuation region, there has been known an electric field attenuation region of the structure which arranges the electric field attenuation region between a channel region and a drain region of the semiconductor layer as well as between the channel region and a source region in plane, and an electric field attenuation region of the structure which vertically arranges the electric field attenuation region in an overlapping manner with the drain electrode and the source electrode. The structure of the latter electric field attenuation region is disclosed in detail in JP-A-2001-102584, for example.

SUMMARY OF THE INVENTION

However, in the above-mentioned thin film transistor of the display device in which the electric field attenuation region is formed in plane, it is necessary to form a region which exhibits the low impurity concentration compared with the drain electrode or the source electrode and hence, the manufacturing processing requires a masking step.

However, in the above-mentioned thin film transistor of the display device in which the electric field attenuation region is formed vertically, it is necessary to form a semiconductor layer which functions as the electric field attenuation region besides the semiconductor layer which functions as the channel region.

Accordingly, in any cases, the constitution of the thin film transistor becomes complicated thus giving rise to a drawback that manufacturing man-hours are increased.

Accordingly, it is an object of the present invention to provide a display device having thin film transistors which can reduce an OFF current in spite of the extremely simple constitution.

To explain the summary of typical inventions among inventions described in this specification, they are as follows.

(1) According to a first aspect of the present invention, for example, there is provided a display device having thin film transistors on a substrate, wherein each thin film transistor includes a gate electrode which is connected with a gate signal line, a semiconductor layer which is formed astride the gate electrode by way of an insulation film, a drain electrode which is connected with a drain signal line and is formed on the semiconductor layer, and a source electrode which is formed on the semiconductor layer in a state that the source electrode faces the drain electrode in an opposed manner, and a side of the drain electrode which faces the source electrode does not overlap the gate electrode as viewed in a plan view, and a side of the source electrode which faces the drain electrode does not overlap the gate electrode as viewed in a plan view.

(2) According to a second aspect of the present invention, for example, there is provided a display device having thin film transistors, wherein each thin film transistor includes a drain electrode which is connected with a drain signal line, a source electrode which faces the drain electrode in an opposed manner, a semiconductor layer which is formed in a region between the drain electrode and the source electrode in a state that the semiconductor layer overlaps the drain electrode and the source electrode, and a gate electrode which is formed in the region between the drain electrode and the source electrode formed on the semiconductor layer by way of an insulation film, and a side of the drain electrode which faces the source electrode does not overlap with the gate electrode as viewed in a plan view, and a side of the source electrode which faces the drain electrode does not overlap the gate electrode as viewed in a plan view.

(3) The display device according to the present invention is characterized in that the side of the drain electrode which faces the source electrode is spaced apart from the gate electrode by a value which falls within a range from 0 to 5 µm as viewed in a plan view, and the side of the source electrode which faces the drain electrode is spaced apart from the gate electrode by a value which falls within a range from 0 to 5 µm as viewed in a plan view.

(4) The display device according to the present invention is characterized in that the side of the drain electrode which faces the source electrode is spaced apart from the gate electrode by a value which falls within a range from 2 to 5 µm as viewed in a plan view, and the side of the source electrode which faces the drain electrode is spaced apart from the gate electrode by a value which falls within a range from 2 to 5 µm as viewed in a plan view.

DESCRIPTION OF THE PREFERRED EMBODIMENT

Hereinafter, an embodiment of a display device according to the present invention is explained in conjunction with drawings.

<Pixel and Equivalent Circuit in the Vicinity of Pixel>

Figure 2:
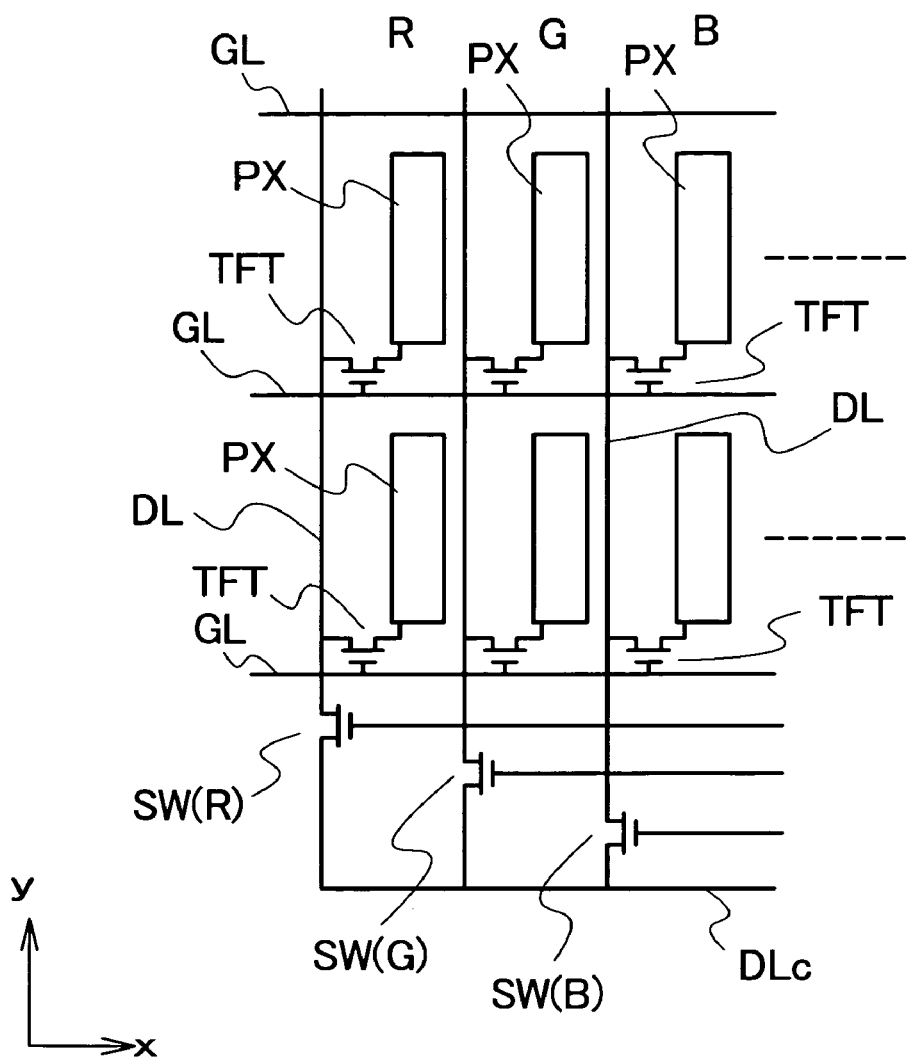
FIG. 2 is an equivalent circuit diagram showing one embodiment of a pixel of the display device according to the present invention.

FIG. 2 is, for example, in a liquid crystal display device, a circuit diagram showing an equivalent circuit formed on a liquid-crystal-side display region portion of one substrate out of respective substrates which are arranged to face each other in an opposed manner with liquid crystal therebetween.

In FIG. 2, in the display region portion, out of the respective pixels arranged in a matrix array, an equivalent circuit consisting of 6 pieces of pixel (6=2×3) is shown.

In FIG. 2, each pixel has a region thereof defined from regions of other neighboring pixels by a pair of neighboring drain signal lines DL which extends in the y direction in the drawing and a pair of neighboring gate signal lines GL which extends in the x direction in the drawing.

Here, a thin film transistor TFT which adopts the MIS (Metal Insulator Semiconductor) type structure is formed on a corner of the pixel. A gate electrode of the thin film transistor is connected to the gate signal line GL arranged adjacent to the gate electrode, and the drain electrode of the thin film transistor is connected to the drain signal line DL arranged adjacent to the drain electrode.

Further, a pixel electrode PX is arranged within a region of each pixel, and the pixel electrode PX is connected to a source electrode of the thin film transistor TFT.

Although not shown in the drawing, on a liquid-crystal-side display region portion of another substrate out of respective substrates arranged to face each other in an opposed manner with liquid crystal therebetween, a counter electrode which is used in common with respect to the respective pixels is arranged to face the respective pixel electrodes PX in an opposed manner.

In the circuit having such a constitution, by applying a reference voltage (a voltage used as the reference with respect to a video signal) to the counter electrode, and by sequentially applying a gate voltage to the gate signal lines GL in order from above in the drawing, for example, the pixel rows are selected. By applying the video signal to the respective drain signal lines DL at timing of such selection, in the respective pixels of the pixel row, a voltage of the video signal is applied to the pixel electrode PX via the thin film transistor TFT which is turned on in response to the gate voltage. Then, an electric field having intensity corresponding to the voltage of the video signal is generated between the pixel electrode PX and the counter electrode thus activating molecules of the liquid crystal corresponding to the intensity of the electric field.

Further, the above-mentioned respective pixels are pixels which are positioned on a lower portion of the display region, for example, and so-called time-division switches SW(R), SW(G), SW(B) are formed below the respective pixels.

That is, pixels of red (R), green (G) and blue (B) arranged parallel to each other in the x direction in the drawing are sequentially repeated and are allocated to respective colors. Three neighboring pixels which are allocated to the respective colors of red (R), green (G) and blue (B) constitute one pixel for color display. Here, in the drawing, the color to which the pixels which are arranged in parallel to each other in the y direction are allocated is common color.

A video signal is supplied to the drain signal line DL for the pixels allocated to red from the common drain signal line DLc through the time-division switch SW(R), a video signal is supplied to the drain signal line DL for the pixels allocated to green from the common drain signal line DLc through the time-division switch SW(G) and a video signal is supplied to the drain signal line DL for the pixels allocated to blue from the common drain signal line DLc through the time-division switch SW(B).

When the respective time-division switches SW(R), SW(G), SW(B) are turned on in time-division in response to the signals supplied to gates of these switches, the video signals from the common drain signal line DLc are supplied to the respective pixels allocated to different colors.

Each time-division switch SW(R), SW(G), SW(B) is constituted in the same manner as the thin film transistor TFT and is simultaneously formed with the formation of the thin film transistor TFT.

Due to such a constitution, the respective drain signal lines DL which supply the video signals to the respective pixels allocated to red (R), green (G), blue (B) can be formed into one common drain signal line DLc in front of the respective time-division switches SW(R), SW(G), SW(B).

<Constitution of Pixel>

Figure 3A:
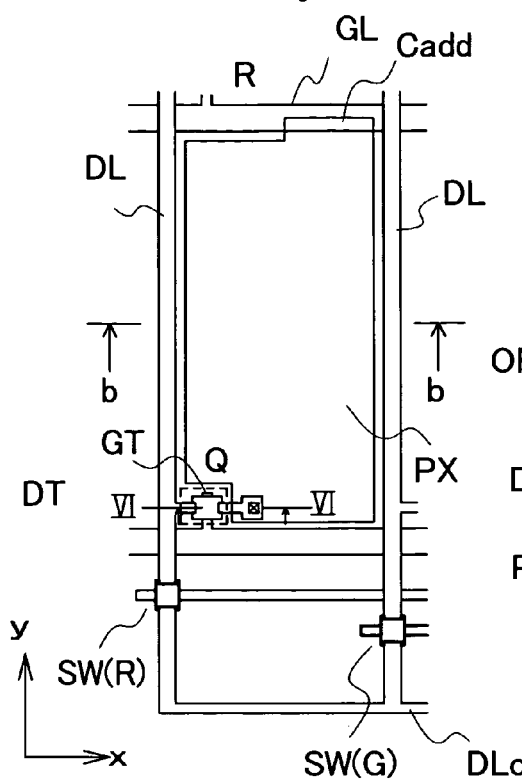
FIG. 3A and FIG. 3B are constitutional views showing one embodiment of the pixel of the display device according to the present invention.
Figure 3B:
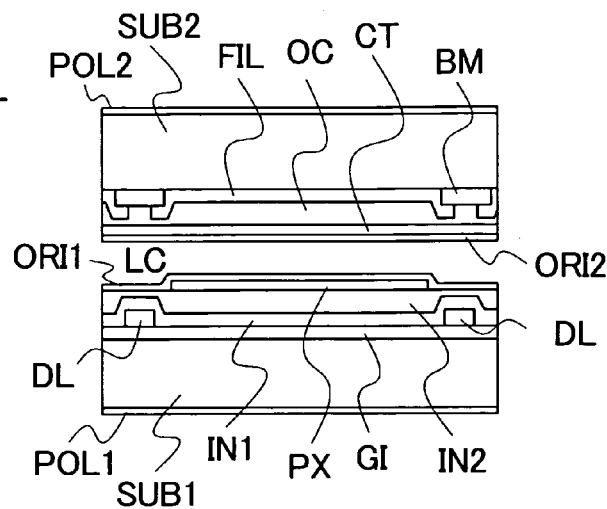

FIG. 3A is a plan view showing the constitution of one pixel on a liquid-crystal-side surface (a main surface) of the substrate SUB1 which includes the equivalent circuit shown in FIG. 2. Further, FIG. 3B shows a cross section taken along a line b-b in FIG. 3A, wherein a substrate SUB2 which is arranged to face the substrate SUB1 in an opposed manner is also depicted.

The above-mentioned pixel indicates the pixel allocated to red (R), for example, and the above-mentioned time-division switches SW(R), SW(G) are also depicted.

On the main surface of the substrate SUB1, first of all, the gate signal lines GL which extend in the x direction in the drawing and are arranged in parallel to each other in the y direction are formed. These respective gate signal lines GL define a region of one pixel together with the drain signal lines DL described later.

The gate signal line GL forms an extending portion projecting toward a pixel side on a portion thereof, and the extending portion constitutes the gate electrode GT of the thin film transistor TFT described later.

On the main surface of the substrate SUB1, an insulation film GI is formed in a state that the insulation film GI also covers the gate signal lines GL. The insulation film GI functions as a gate insulation film for the thin film transistor TFT and also functions as an interlayer insulation film between the gate signal lines GL and the drain signal lines DL.

On a region of a surface of the insulation film GI where the thin film transistor TFT is formed, a semiconductor layer PS which overlaps with the gate electrode GT in a striding manner is formed in an island shape. The semiconductor layer PS is formed of a semiconductor layer made of poly-silicon, for example.

Further, on the surface of the insulation film GI, the drain signal lines DL which extend in the y direction in the drawing and are arranged parallel to each other in the x direction in the drawing are formed.

The drain signal line DL forms an extending portion which extends in a state that the extending portion overlaps with the semiconductor layer PS of the thin film transistor TFT on a portion thereof, and the extending portion constitutes the drain electrode DT of the thin film transistor TFT.

Further, in forming the drain signal lines DL, the source electrode ST of the thin film transistor TFT is formed on the semiconductor layer PS in a state that the source electrode ST faces the drain electrode DT in an opposed manner.

The source electrode ST extends toward the pixel side after getting over the region where the semiconductor layer PS is formed, and includes a pad portion PD provided for connecting the source electrode ST with the pixel electrode PX described later.

The thin film transistor TFT having such a constitution constitutes an MIS (Metal Insulator Semiconductor) type transistor which is referred to as the so-called bottom gate structure. In such an MIS type transistor, naming of the drain electrode DT and the source electrode ST is determined based on a state of a bias, in this specification, for the sake of convenience, an electrode on a side which is connected to the drain signal line DL is referred to as the drain electrode DT, and an electrode on a side connected to the pixel electrode PX is referred to as the source electrode ST. The detailed constitution of the thin film transistor TFT is explained later in conjunction with FIG. 1.

On the main surface of the substrate SUB1, a protective film IN1 and a leveling film IN2 are sequentially formed in a stacked manner such that the protective film IN1 and the leveling film IN2 also cover the thin film transistors TFT having the above-mentioned constitution. The protective film IN1 is provided for obviating the direct contact of the liquid crystal LC with the thin film transistors TFT.

On a surface of the leveling film IN2, transparent pixel electrodes PX formed of an ITO (Indium Tin Oxide) film, for example, are formed. The pixel electrodes PX are electrically connected with the source electrodes ST (pad portions PD) of the thin film transistors TFT via through holes formed in the leveling film IN2 and the protective film IN1.

Here, the pixel electrode PX is formed to partially overlap with another gate signal line GL which faces the gate signal line GL for driving the thin film transistor TFT with the pixel electrode PX sandwiched therebetween, and a capacitive element Cadd is formed between the gate signal line GL and another gate signal line GL. The capacitive element Cadd is provided for storing a video signal supplied to the pixel electrode PX for a relatively long time.

Further, on a main surface of the substrate SUB1, an orientation film ORI1 is formed in a state that the orientation film ORI1 also covers the pixel electrode PX. The orientation film ORI1 is a film which is brought into direct contact with the liquid crystal LC, and is provided for determining the initial orientation direction of molecules of the liquid crystal LC together with an orientation film ORI2 described later which is formed on the substrate-SUB2 side.

Here, a polarizer POL1 is formed on a surface of the substrate SUB1 on a side opposite to the liquid crystal LC, and the polarizer POL1 is provided for visualizing the behavior of the molecules of the liquid crystal LC together with a polarizer POL2 described later which is formed on the substrate-SUB2 side.

With respect to the substrate SUB2 which is arranged to face the substrate SUB1 having such a constitution with the liquid crystal LC therebetween, as shown in FIG. 3B, first of all, a black matrix BM is formed on a liquid-crystal-side surface (main surface) of the substrate SUB2.

The black matrix BM is, for example, formed to define the pixel from other neighboring pixels, and an opening is formed in a portion of the pixel except for a periphery of the pixel.

On each opening portion of the black matrix BM, a color filter FIL is formed such that the color filter FIL covers the opening. A leveling film OC is formed on surfaces of the color filters FIL such that the leveling film OC also covers the black matrix BM.

A transparent counter electrode CT formed of an ITO (Indium Tin Oxide) film, for example, is formed on a surface of the leveling film OC. The counter electrode CT is formed on the whole area of the display region portion and is used in common by the respective pixels.

The orientation film ORI2 is formed on a surface of the counter electrode CT, and the polarizer POL2 is formed on a surface of the substrate SUB2 on a side opposite to the liquid crystal LC.

(Constitution of Thin Film Transistor)

Figure 1A:
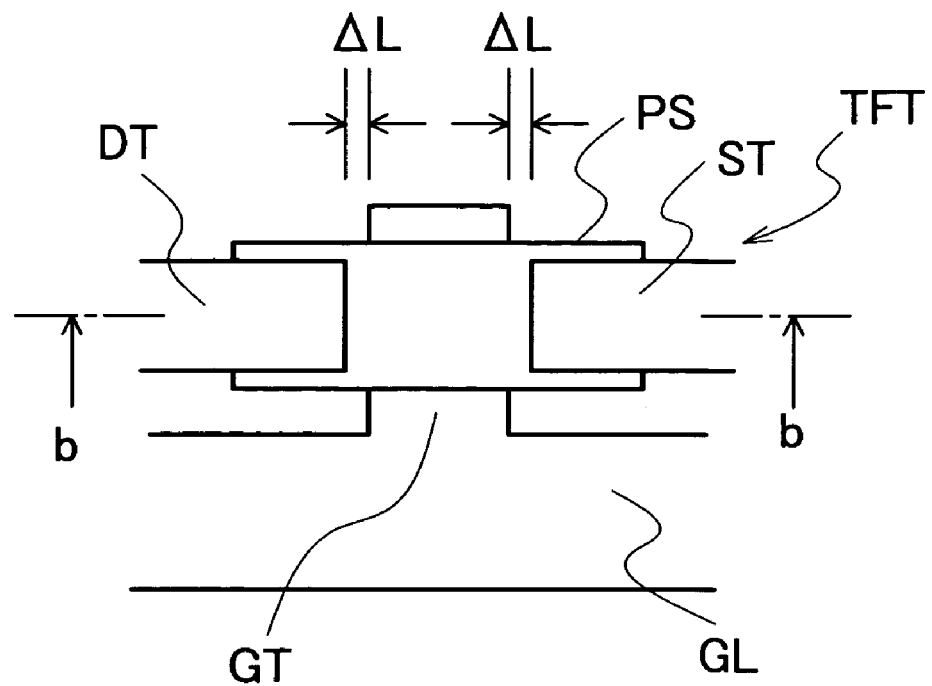
FIG. 1A and FIG. 1B are constitutional views of an essential part showing one embodiment of a display device according to the present invention.
Figure 1B:
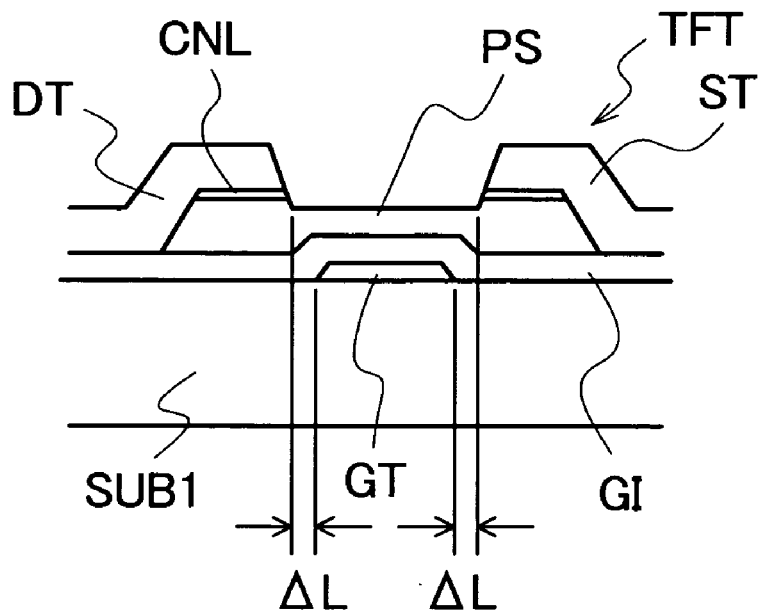

FIG. 1A is a plan view showing the constitution of the thin film transistor TFT in detail, and also is a view corresponding to a portion surrounded by a dotted frame Q in FIG. 3A. Further, FIG. 1B is a cross-sectional view taken along a line b-b in FIG. 1A. In FIG. 1B, the protective film IN1, the leveling film IN2 and the like shown in FIG. 3B are omitted.

The gate electrode GT is formed of an extending portion which projects from the gate signal line GL. A semiconductor layer PS is formed on the gate electrode GT by way of an insulation film GI.

The semiconductor layer PS is formed across the gate electrode GT in a state that both ends of the semiconductor layer PS sufficiently project from both sides of the gate electrode GT.

That is, the semiconductor layer PS functions as a channel region at a portion thereof which overlaps with the gate electrode GT, and functions as the drain region and the source region respectively at the portions projecting from both sides of the gate electrode GT.

Further, the drain electrode DT is formed to overlap with the drain region of the semiconductor layer PS, and the source electrode ST is formed to overlap with the source region of the semiconductor layer PS.

In such a constitution, in this embodiment, the drain electrode DT is formed such that a side of the drain electrode DT which faces the source electrode ST in an opposed manner is arranged to be spaced-apart from a side of the gate electrode GT on a drain-electrode-DT side by ΔL (2 μm, for example). That is, the drain electrode DT is formed such that a side portion of the drain electrode DT which faces the source electrode ST in an opposed manner does not overlap with a side portion of the gate electrode GT on the drain-electrode-DT side.

Further, the source electrode ST is formed such that a side of the source electrode ST which faces the drain electrode DT in an opposed manner is arranged to be spaced-apart from a side of the gate electrode GT on a source-electrode-ST side by ΔL. That is, the source electrode ST is formed such that a side portion of the source electrode ST which faces the drain electrode DT in an opposed manner does not overlap with a side portion of the gate electrode GT on the source-electrode-ST side.

The thin film transistor TFT having such a constitution is formed such that neither the drain electrode DT nor the source electrode ST overlaps with the gate electrode GT as viewed in a plan view. Accordingly, it is possible to form a region of high resistance between the drain electrode DT and the gate electrode GT as well as between the source electrode ST and the gate electrode GT and hence, it is possible to provide the constitution which almost prevents an electric field from being concentrated on these regions. That is, the regions of the semiconductor layer PS which are indicated as ΔL in FIG. 1 function as electric field concentration attenuation regions.

In the thin film transistor TFT shown in FIG. 1, a contact layer CNL formed of a semiconductor layer having high impurity concentration is formed on an interface between the drain electrode DT and the semiconductor layer PS as well as on an interface between the source electrode ST and the semiconductor layer PS respectively.

In FIG. 3A, the time-division switch SW(R) has one electrode out of a drain electrode and a source electrode thereof connected to the drain signal line DL of the pixel, and has another electrode thereof connected to the common drain signal line DLc. In the same manner, the time-division switch SW(G) has one electrode out of a drain electrode and a source electrode thereof connected to the drain signal line DL of the neighboring pixel arranged on a right side of the above-mentioned pixel in the drawing, and has another electrode thereof connected to the common drain signal line DLc.

As described above, these time-division switches SW(R), SW(G) have the substantially equal constitution as the thin film transistor TFT, wherein the gate electrodes of these switches are connected in common with the gate electrodes of the time-division switches SW connected with the drain signal lines DL of the pixels allocated to the same color.

(Characteristic of Thin Film Transistor)

Figure 4:
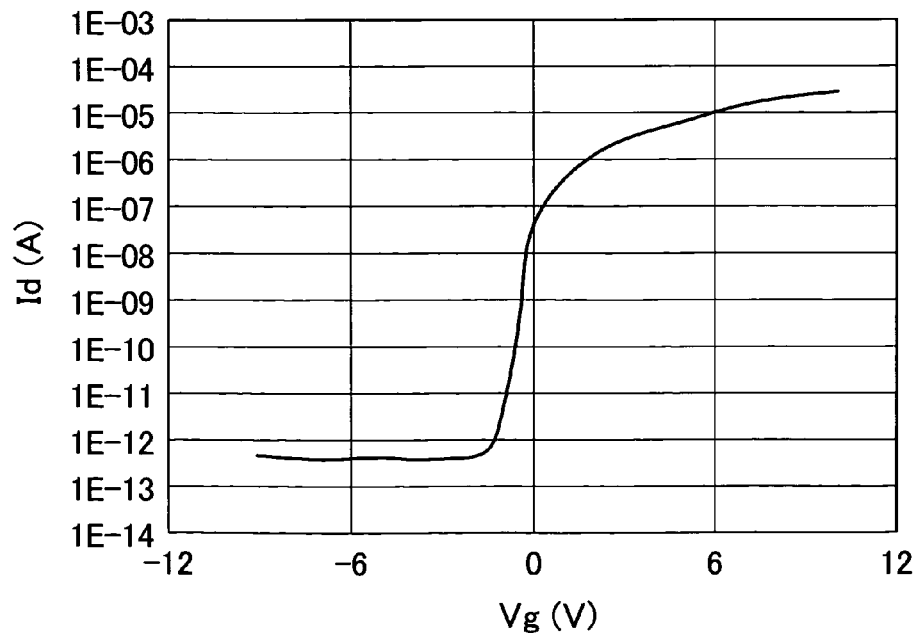
FIG. 4 is a graph showing a characteristic of a thin film transistor of the display device according to the present invention.

FIG. 4 is a graph showing the gate voltage (Vg)-drain current (Id) characteristic of the above-mentioned thin film transistor TFT. In FIG. 4, the gate voltage (Vg) is taken on an axis of abscissas, and the drain current (Id) is taken on an axis of ordinates. It is understood from the graph that a drain current value largely differs between a case in which a positive (+) voltage is applied to the gate electrode GT of the thin film transistor TFT and a case in which a negative (−) voltage is applied to the gate electrode GT of the thin film transistor TFT so that the thin film transistor TFT which is reliable as a switching element can be acquired.

With the use of the thin film transistor TFT having such a constitution, it is sufficient to take only the arrangement relationship of the drain electrode DT and the source electrode ST with respect to the gate electrode GT into consideration and hence, it is possible to acquire an advantageous effect that a particular step for forming an electric field concentration attenuation region becomes unnecessary.

Figure 5A:
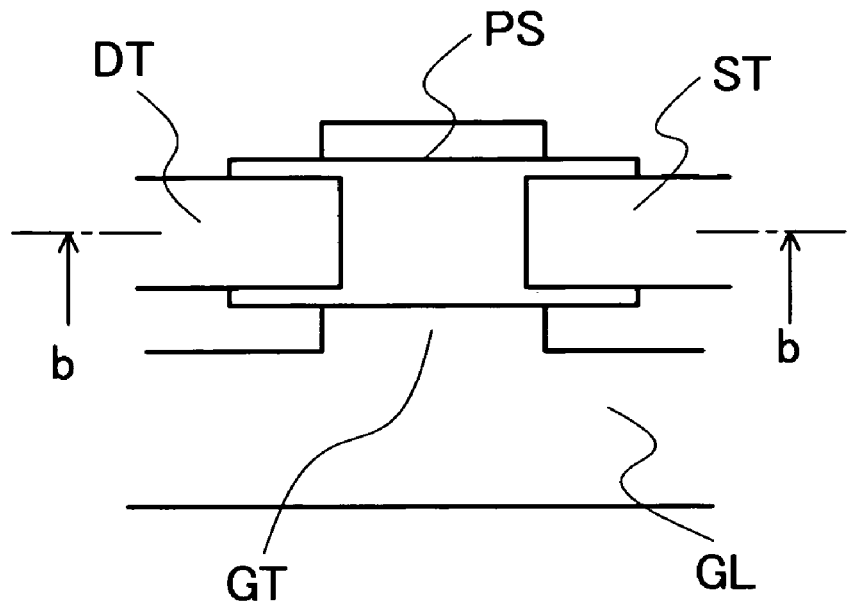
FIG. 5A and FIG. 5B are explanatory views showing one example of a thin film transistor of a conventional display device.
Figure 5B:
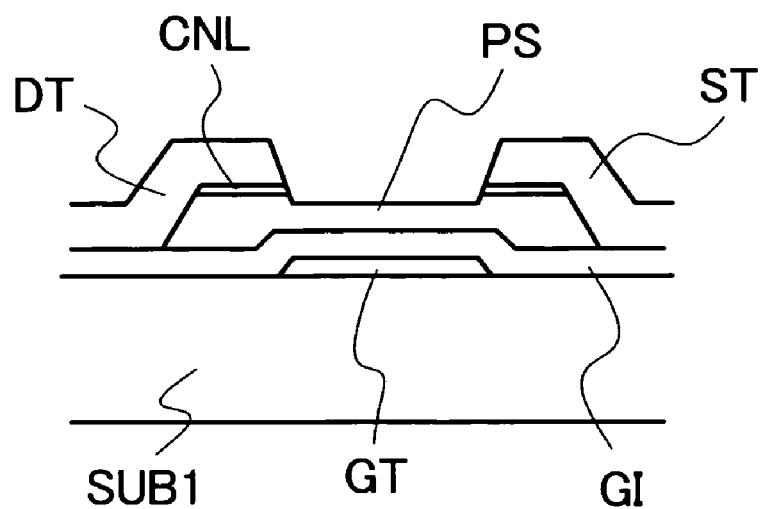

FIG. 5 shows the constitution of a conventional thin film transistor and is depicted corresponding to the constitution shown in FIG. 1.

As can be understood from FIG. 5, the drain electrode DT is formed such that a side portion of the drain electrode DT which faces the source electrode ST in an opposed manner overlaps with a side portion of the gate electrode GT on a drain-electrode-DT side, and the source electrode ST is formed such that a side portion of the source electrode ST which faces the drain electrode DT in an opposed manner overlaps with a side portion of the gate electrode GT on a source-electrode-ST side.

Figure 6:
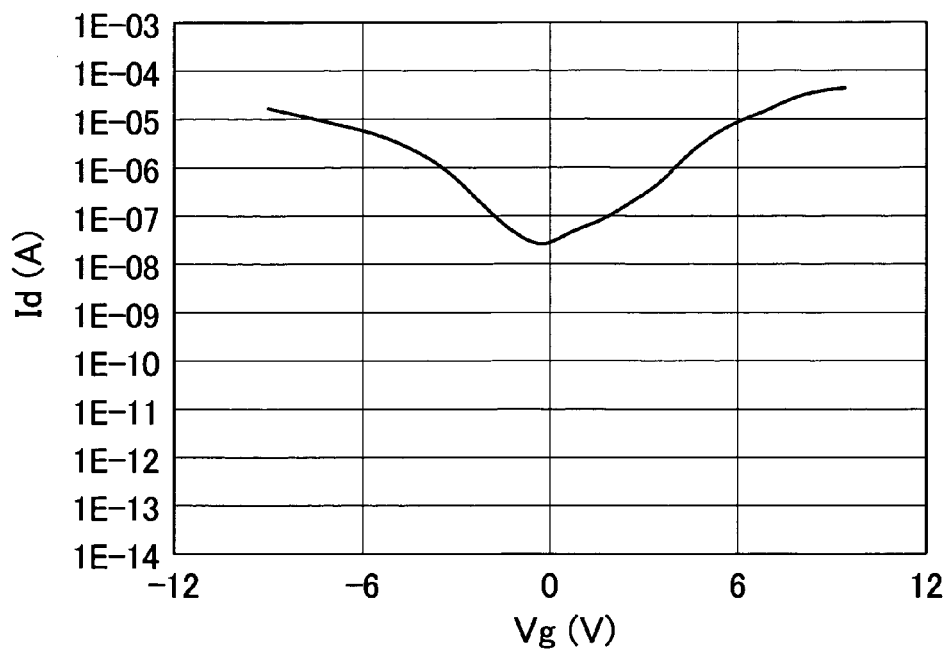
FIG. 6 is a graph showing a characteristic of the thin film transistor of the conventional display device.

With respect to the gate voltage (Vg)-drain current (Id) characteristic of the thin film transistor TFT having such a constitution, as shown in FIG. 6 which is depicted corresponding to FIG. 4, no clear difference arises in a drain current value between a case in which a positive (+) voltage is applied to the gate electrode GT and a case in which a minus (−) voltage is applied to the gate electrode GT. In this manner, the conventional thin film transistor shown in FIG. 6 is inappropriate as the switching element.

Figure 7:
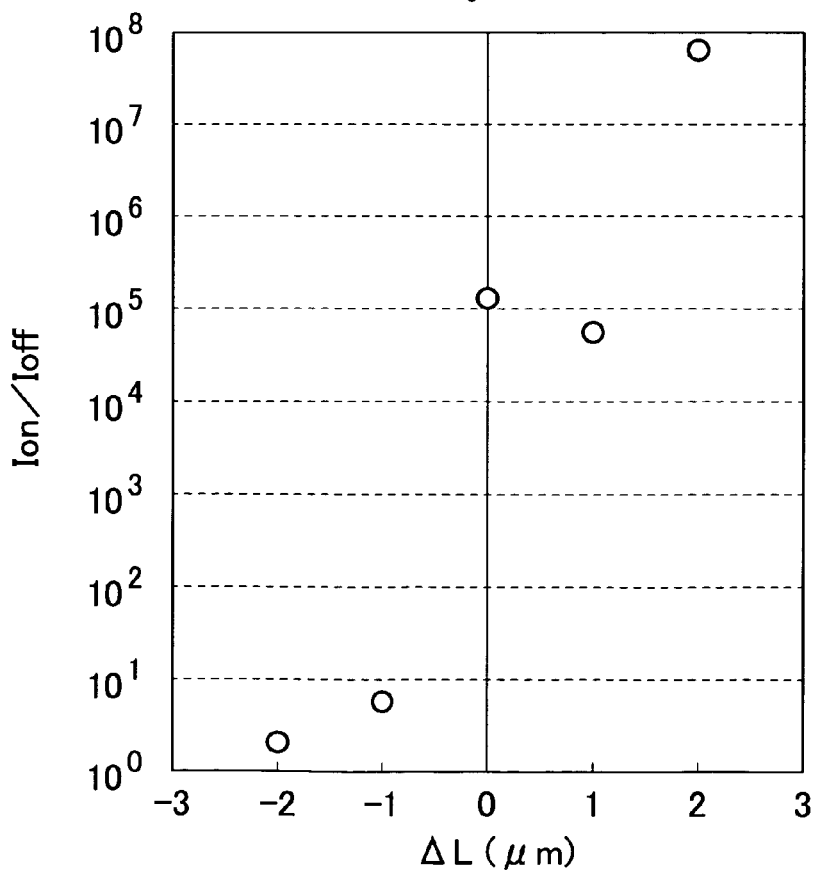
FIG. 7 is a graph showing an effect of the thin film transistor of the display device according to the present invention in comparison with an effect of the conventional thin film transistor.

Further, FIG. 7 is a graph showing, in the thin film transistor TFT of this embodiment, a ratio between an ON current Ion and an OFF current Ioff when the distance ΔL between the side of the drain electrode DT which faces the source electrode ST in an opposed manner and the side of the gate electrode GT on the drain-electrode-DT side is set to 0.1 μm and the distance ΔL between the side of the source electrode ST which faces the drain electrode DT in an opposed manner and the side of the gate electrode GT on the source-electrode-ST side is set to 2 μm. The distance ΔL is taken on an axis of abscissas, and a ratio Ion/Ioff is taken on an axis of ordinates.

Further, in this graph, for comparison, a ratio between a ratio Ion/Ioff of the conventional thin film transistor is also shown. In this case, a width ΔL by which the side portion of the drain electrode DT which faces the source electrode ST in an opposed manner and the side portion of the gate electrode GT on the drain-electrode-DT side overlap with each other, and a width ΔL by which the side portion of the source electrode ST which faces the drain electrode DT in an opposed manner and the side portion of the gate electrode GT on the source-electrode-ST side overlap with each other are respectively indicated with minus (−). Accordingly, in this graph, with respect to an axis of abscissas, a value of ΔL equal to or more than 0 indicates the characteristic of the thin film transistor TFT according to the present invention, and the value of ΔL below 0 indicates the characteristic of the conventional thin film transistor. As can be understood from FIG. 7, the thin film transistor TFT according to the present invention can largely increase the ratio Ion/Ioff. This implies that the thin film transistor TFT according to the present invention can acquire the reliability as a switching element.

Here, in FIG. 7, the characteristic is acquired by setting the distances (ΔL) of the drain electrode DT and the source electrode ST of the thin film transistor TFT relative to the gate electrode GT of the thin film transistor TFT to 0 μm, 1 μm and 2 μm respectively. However, inventors of the present invention have found that the advantageous effect can be further increased by setting the distance (ΔL) to 3 μm, 4 μm and 5 μm. Accordingly, the distance (ΔL) of the drain electrode DT and the source electrode ST of the thin film transistor TFT relative to the gate electrode GT of the thin film transistor TFT may be set to a value which falls within a range from 0 to 5 μm. It is more preferable to set the distance (ΔL) to a value which falls within a range from 2 to 5 μm.

(Manufacturing Method)

FIG. 8A to FIG. 8F are a flow chart showing one embodiment of a manufacturing method of the display device according to the present invention, wherein steps are shown in a form of a cross sectional view (a cross-sectional view taken along a line VI-VI in FIG. 3A) mainly showing a thin-film-transistor-TFT forming portion. Steps are sequentially explained hereinafter.

Step 1

Figure 8A:
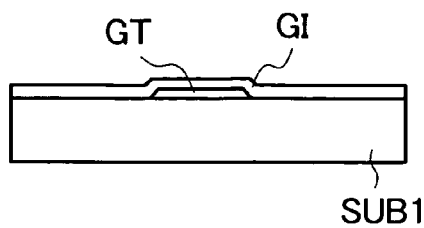
FIG. 8 is a flow chart showing one embodiment of a manufacturing method of the display device according to the present invention.

As shown in FIG. 8A, the gate electrodes GT (gate signal lines GL) are formed on the main surface of the substrate SUB1 made of glass, for example, and, thereafter, the insulation film GI is formed on the main surface of the substrate SUB1 in a state that the insulation film GI also covers the gate electrodes GT (gate signal lines GL). The gate electrode GT (gate signal line GL) is formed of a film made of Mo or Mo alloy, for example, and having a film thickness of approximately 50 to 150 nm. The insulation film GI is formed of a film made of SiO or SiN, for example, and having a film thickness of approximately 100 to 300 nm.

Step 2

Figure 8B:
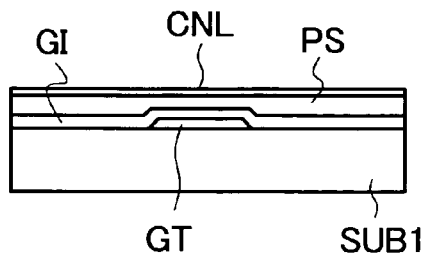

As shown in FIG. 8B, an amorphous silicon layer is formed on a surface of the insulation film GI by a CVD method, for example. After applying the dehydration treatment to the amorphous silicon layer, pulses or continuous oscillating laser beams are applied to crystallize the amorphous silicon layer thus forming the semiconductor layers PS made of poly-silicon. Further, on an upper surface of the semiconductor layer PS, a contact layer CNL formed of a semiconductor layer doped with, for example, phosphor (P) in high density is formed. A film thickness of the semiconductor layer PS is set to approximately 50 to 300 nm, for example, and a film thickness of the contact layer CNL is set to approximately 20 to 50 nm, for example.

Step 3

Figure 8C:
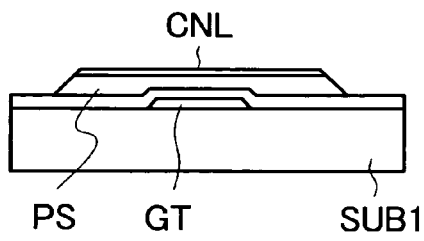

As shown in FIG. 8C, a stacked body constituted of the semiconductor layer PS and the contact layer CNL is formed in an island shape by selective etching using a photolithography technique.

Step 4

Figure 8D:
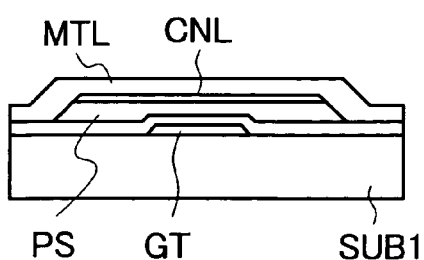

As shown in FIG. 8D, a metal layer MTL is formed on the main surface of the substrate SUB1 in a state that the metal layer MTL also covers the stacked body constituted of the semiconductor layer PS and the contact layer CNL formed by selective etching. The metal layer MTL is formed of a film made of Al or Al alloy and having a thickness of approximately 30 to 100 nm by sputtering, for example. Here, on an upper surface of the Al layer or the Al alloy layer, a high-melting-point metal film made of Ti, Mo or the like and having a film thickness of approximately 30 to 100 nm may be formed. Such a barrier metal layer is provided for preventing the diffusion of Al.

Step 5

Figure 8E:
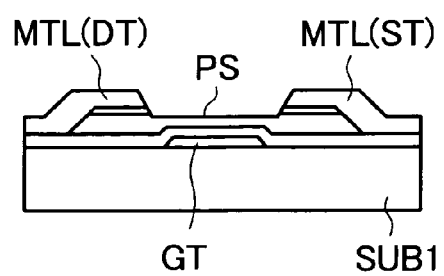

As shown in FIG. 8E, the drain electrodes DT and the source electrodes ST are formed by applying selective etching to the metal layer MTL using a photolithography technique. Although not shown in the drawing, the drain signal lines DL connected with the drain electrodes DT and the pad portions PD connected with the source electrodes ST are also formed simultaneously with the formation of the drain electrodes DT and the source electrodes ST.

Further, using the drain electrodes DT and the source electrodes ST as masks, the contact layers CNL exposed from the drain electrodes DT and the source electrodes ST are etched thus exposing surfaces of the semiconductor layers PS formed below the contact layers CNL. Due to such a step, the contact layers CNL remain only on an interface between the drain electrodes DT and the semiconductor layers PS and on an interface between the source electrodes ST and the semiconductor layers PS.

Step 6

Figure 8F:
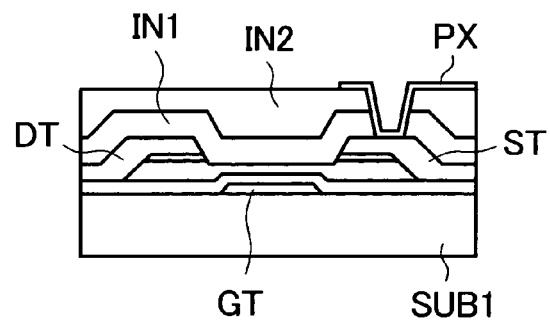

As shown in FIG. 8F, the protective film IN1 and the leveling film IN2 are sequentially formed on the main surface of the substrate SUB1 in a state that these films also cover the drain electrodes DT and the source electrodes ST. The protective film IN1 made of SiN and having a film thickness of approximately 100 to 200 nm is formed by a CVD method, for example. The leveling film IN2 is made of a photosensitive resin, for example.

Further, through holes which penetrate the leveling film IN2 and the protective film IN1 are formed so as to expose portions (pad portions PD) of the source electrodes ST, and the ITO film is formed on a surface of the leveling film IN2.

Then, selective etching using a photolithography technique is applied to the ITO film to form the pixel electrodes PX which are electrically connected with the source electrodes ST via the through hole portions. The ITO film is formed with a film thickness of approximately 50 to 150 nm by sputtering, for example.

Here, in the embodiment described above, the so-called bottom-gate-type thin film transistor has been explained. However, the embodiment is also applicable to a so-called top-gate-type thin film transistor.

In the so-called top-gate-type thin film transistor, a drain electrode and a source electrode are arranged spaced-apart from each other, a semiconductor layer is formed in a region between the drain electrode and the source electrode in a state that the semiconductor layer overlaps with the drain electrode and the source electrode, and the gate electrode is formed over the semiconductor layer by way of the insulation film in the region between the drain electrode and the source electrode.

Then, in this case, as viewed in a plan view, the side of the drain electrode which faces the source electrode in an opposed manner does not overlap with the gate electrode, and the side of the source electrode which faces the drain electrode in an opposed manner does not overlap with the gate electrode.

In this embodiment, the so-called vertical-electric-field liquid crystal display device has been explained. However, the present invention is not limited to such a liquid crystal display device. For example, the present invention is also applicable to a so-called lateral-electric-field (IPS (In-Plane-Switching) method, for example) liquid crystal display device. This is because the lateral-electric-field liquid crystal display device also includes a thin film transistor TFT in each pixel thereof and the thin film transistor TFT has the same task to be solved described above.

Further, the above-described embodiment has been explained in conjunction with the liquid crystal display device. However, the present invention is not limited to the liquid crystal display device. For example, the present invention is applicable to other display device such as an organic EL display device. This is because other display device also includes a thin film transistor TFT in each pixel thereof and the thin film transistor TFT has the same task to be solved described above.

The above-mentioned respective embodiments may be used in a single form or in combination. This is because the advantageous effects acquired by the respective embodiments can be realized independently or in a synergistic manner.

What is claimed is:

1. A display device comprising:
   a substrate;
   thin film transistors which are formed on the substrate;
   gate signal lines;
   gate electrodes which are connected to the gate signal lines;
   semiconductor layers each of which is formed across the gate electrodes by way of an insulation film, each semiconductor layer being formed into a polysilicon layer by radiation of laser beams;
   a contact layer having a high impurity concentration and being formed above the semiconductor layers;
   drain signal lines;

drain electrodes each of which is connected with the drain signal lines and is formed on the semiconductor layers by way of the contact layer; and source electrodes each of which is formed on the semiconductor layers by way of the contact layer in a state that a side of the source electrodes faces a side of the drain electrodes in an opposed manner, wherein a first side of the contact layer is formed between the semiconductor layers and the drain electrodes and does not overlap the gate electrodes as viewed in a plan view, and a first side of the contact layer is formed between the semiconductor layers and the source electrodes and does not overlap the gate electrodes as viewed in a plan view.

2. A display device according to claim 1, wherein the side of the drain electrode which faces the source electrode is spaced apart from the gate electrode by a value which falls within a range from 0 to 5 µm as viewed in a plan view, and the side of the source electrode which faces the drain electrode is spaced apart from the gate electrode by a value which falls within a range from 0 to 5 µm as viewed in a plan view.

3. A display device according to claim 1, wherein the side of the drain electrode which faces the source electrode is spaced apart from the gate electrode by a value which falls within a range from 2 to 5 µm as viewed in a plan view, and the side of the source electrode which faces the drain electrode is spaced apart from the gate electrode by a value which falls within a range from 2 to 5 µm as viewed in a plan view.

4. A display device according to claim 1, wherein the semiconductor layer is made of poly-silicon.

5. A display device according to claim 1, wherein a display region in which a plurality of pixels is arranged and a peripheral region which surrounds the display region are formed on the substrate, and the thin film transistor is formed in each pixel.

6. A display device according to claim 1, wherein a display region in which a plurality of pixels is arranged and a peripheral region which surrounds the display region are formed on the substrate, and the thin film transistors are formed in the peripheral region.

7. A display device comprising:
thin film transistors;
drain signal lines;
drain electrodes each of which is connected with the drain signal lines;
source electrodes, a side of the source electrodes facing a side of the drain electrodes;

semiconductor layers each of which is arranged below the drain electrodes and the source electrodes in an overlapping manner and is formed into a poly-silicon layer by radiation of laser beams;

a contact layer having a high impurity concentration and being formed between the semiconductor layers and the source and drain electrodes; and gate electrodes which are formed below the semiconductor layers by way of an insulation layer, wherein a first side of the contact layer is formed between the semiconductor layers and the drain electrodes and does not overlap the gate electrodes as viewed in a plan view, and a first side of the contact layer is formed between the semiconductor layers and the source electrodes and does not overlap the gate electrodes as viewed in a plan view.

8. A display device according to claim 7, wherein the side of the drain electrode which faces the source electrode is spaced apart from the gate electrode by a value which falls within a range from 0 to 5 µM as viewed in a plan view, and the side of the source electrode which faces the drain electrode is spaced apart from the gate electrode by a value which falls within a range from 0 to 5 µm as viewed in a plan view.

9. A display device according to claim 7, wherein the side of the drain electrode which faces the source electrode is spaced apart from the gate electrode by a value which falls within a range from 2 to 5 µm as viewed in a plan view, and the side of the source electrode which faces the drain electrode is spaced apart from the gate electrode by a value which falls within a range from 2 to 5 µm as viewed in a plan view.

10. A display device according to claim 7, wherein the semiconductor layer is made of poly-silicon.

11. A display device according to claim 7, wherein a display region in which a plurality of pixels is arranged and a peripheral region which surrounds the display region are formed on the substrate, and the thin film transistor is formed in each pixel.

12. A display device according to claim 7, wherein a display region in which a plurality of pixels is arranged and a peripheral region which surrounds the display region are formed on the substrate, and the thin film transistors are formed in the peripheral region.

* * * * *